(12) United States Patent
Chen et al.

(10) Patent No.: US 10,451,901 B2
(45) Date of Patent: Oct. 22, 2019

(54) DISPLAY DEVICE ON A SUBSTRATE CONNECTED TO ANOTHER SUBSTRATE WITH CONTACT PADS, VIAS, AND CONDUCTIVE TRACES

(71) Applicant: InnoLux Corporation, Miao-Li County (TW)

(72) Inventors: Yang-Chen Chen, Miao-Li County (TW); Nai-Fang Hsu, Miao-Li County (TW); Yu-Hsien Wu, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 15/690,308

(22) Filed: Aug. 30, 2017

(65) Prior Publication Data

US 2018/0088356 A1   Mar. 29, 2018

(30) Foreign Application Priority Data

Sep. 28, 2016  (CN) .......................... 2016 1 0857475

(51) Int. Cl.
*H05K 1/11* (2006.01)
*G02F 1/01* (2006.01)
(Continued)

(52) U.S. Cl.
CPC ........ *G02F 1/0102* (2013.01); *G02F 1/13452* (2013.01); *G02F 2201/42* (2013.01); *H05B 33/04* (2013.01); *H05B 33/06* (2013.01); *H05B 33/12* (2013.01); *H05K 1/111* (2013.01); *H05K 1/112* (2013.01); *H05K 1/113* (2013.01); *H05K 1/114* (2013.01); *H05K 1/115* (2013.01); *H05K 1/116* (2013.01); *H05K 1/117* (2013.01)

(58) Field of Classification Search
CPC ............ H05K 1/111–117; H05K 1/115; H05B 33/06; H05B 33/12; H05B 33/04
See application file for complete search history.

(56) References Cited

U.S. PATENT DOCUMENTS 5,354,205 A * 10/1994 Feigenbaum .......... G01R 1/073
                                                                205/78
6,050,832 A *  4/2000 Lee ................... H01L 23/49833
                                                                257/E23.063
(Continued)

*Primary Examiner* — Abdullah A Riyami
*Assistant Examiner* — Justin M Kratt
(74) *Attorney, Agent, or Firm* — McClure, Qualey & Rodack, LLP

(57) ABSTRACT

A display device is provided, including a first substrate, a plurality of first contact pads, a second substrate, a plurality of second contact pads, and a plurality of first traces. The first substrate includes a display area and a non-display area. The first contact pads disposed on the non-display area. The second substrate includes a first side and a second side, wherein the first side is opposite to the second side. The second contact pads are disposed on the first side, wherein the second contact pads are electrically connected to the first contact pads. The first traces are disposed on the second side, wherein the first traces are electrically connected to the second contact pads through a plurality of through holes respectively, and one of the through holes overlaps corresponding one of the second contact pads in a normal direction of the second substrate.

17 Claims, 4 Drawing Sheets

(51) Int. Cl.
*G02F 1/1345* (2006.01)
*H05B 33/12* (2006.01)
*H05B 33/06* (2006.01)
*H05B 33/04* (2006.01)

(56) References Cited

U.S. PATENT DOCUMENTS

2015/0031221 A1* 1/2015 Sloey .................... H01R 23/722
  439/66
2016/0088692 A1* 3/2016 Weber .................... H05B 33/02
  313/504

* cited by examiner

DISPLAY DEVICE ON A SUBSTRATE CONNECTED TO ANOTHER SUBSTRATE WITH CONTACT PADS, VIAS, AND CONDUCTIVE TRACES

CROSS REFERENCE TO RELATED APPLICATIONS

This Application claims priority of China Patent Application No. 201610857475.1, filed on Sep. 28, 2016, the entirety of which is incorporated by reference herein.

BACKGROUND

Field of the Disclosure

The present disclosure relates to a display device, and in particular to a display device with contact pads.

Description of the Related Art

With the continuing development of various display technologies, displays utilizing hard carriers (for example, glass substrates), such as liquid-crystal displays (LCD), organic light-emitting diode displays (OLED), and micro-LED displays, have gradually been commercialized and are being applied in display devices of different sizes. Flexible displays made with the flexible substrates have such advantages as being light in weight, flexible, impact resistant, safe, and easy to carry. How to produce a flexible display with a qualified process yield is an important task.

SUMMARY

In one embodiment, a display device is provided. The display device includes a first substrate, a plurality of first contact pads, a second substrate, a plurality of second contact pads, and a plurality of first traces. The first substrate includes a display area and a non-display area, wherein the display area is adjacent to the non-display area. The first contact pads disposed on the non-display area. The second substrate includes a first side and a second side, wherein the first side is opposite to the second side. The second contact pads are disposed on the first side, wherein the second contact pads are electrically connected to the first contact pads. The first traces are disposed on the second side, wherein the first traces are electrically connected to the second contact pads through a plurality of through holes respectively, and one of the through holes overlaps a corresponding one of the second contact pads in a normal direction of the second substrate.

A detailed description is given in the following embodiments with reference to the accompanying drawings.

BRIEF DESCRIPTION OF THE DRAWINGS

The present disclosure can be more fully understood by reading the subsequent detailed description and examples with references made to the accompanying drawings, wherein.

DETAILED DESCRIPTION OF THE DISCLOSURE

Figure 1:
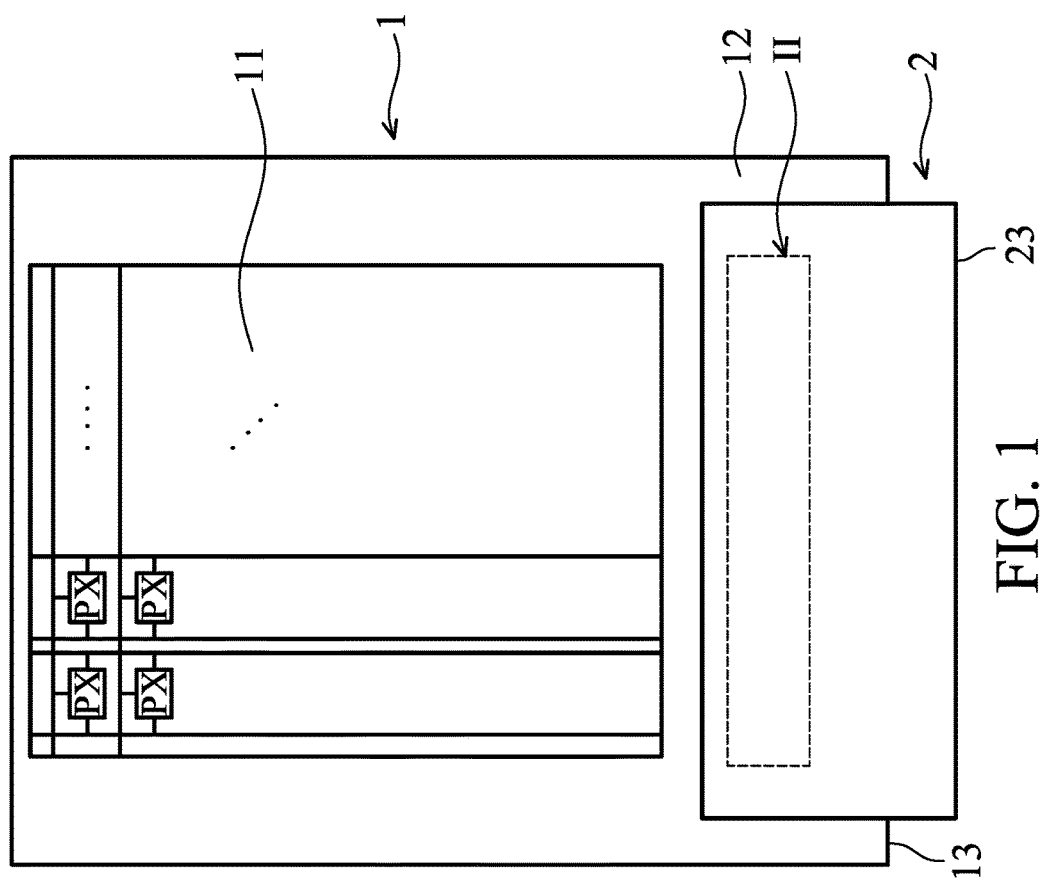
FIG. 1 shows a display device of one embodiment of the disclosure.

FIG. 1 shows a display device D of one embodiment of the disclosure. The display device D includes a first substrate 1 and a second substrate 2. The first substrate 1 includes a display area 11 and a non-display area 12 adjacent to the display area 11. The first substrate 1 can be a rigid substrate or a flexible substrate. The rigid substrate can be made of glass, sapphire or ceramic. The flexible substrate can be made of organic materials such as polyimide, polycarbonate or polyethylene terephthalate. The second substrate 2 can be a flexible substrate. However, the present disclosure is not limited to the above examples.

Figure 2:
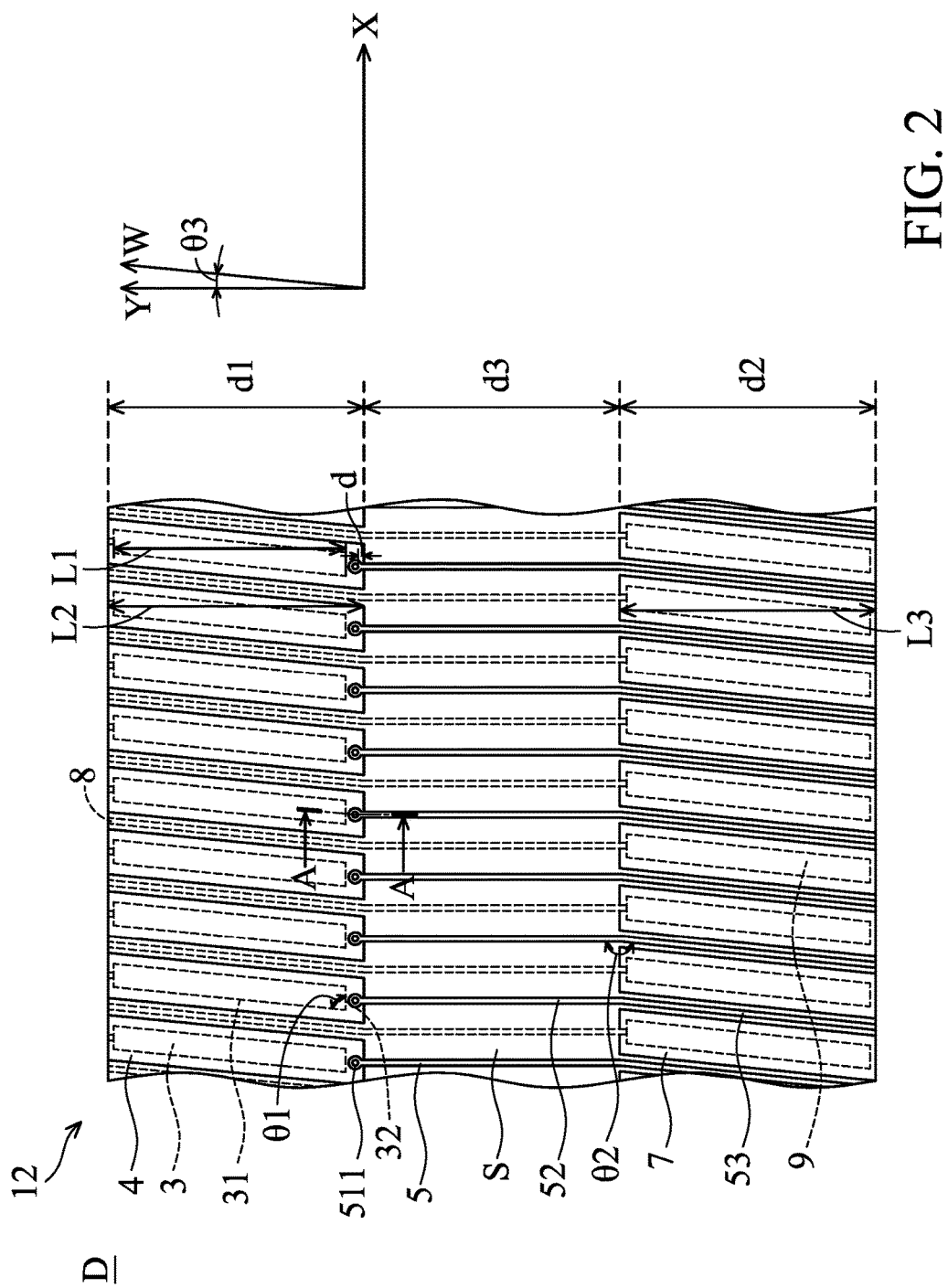
FIG. 2 is an enlarged top view of the area II of FIG. 1.
Figure 3:
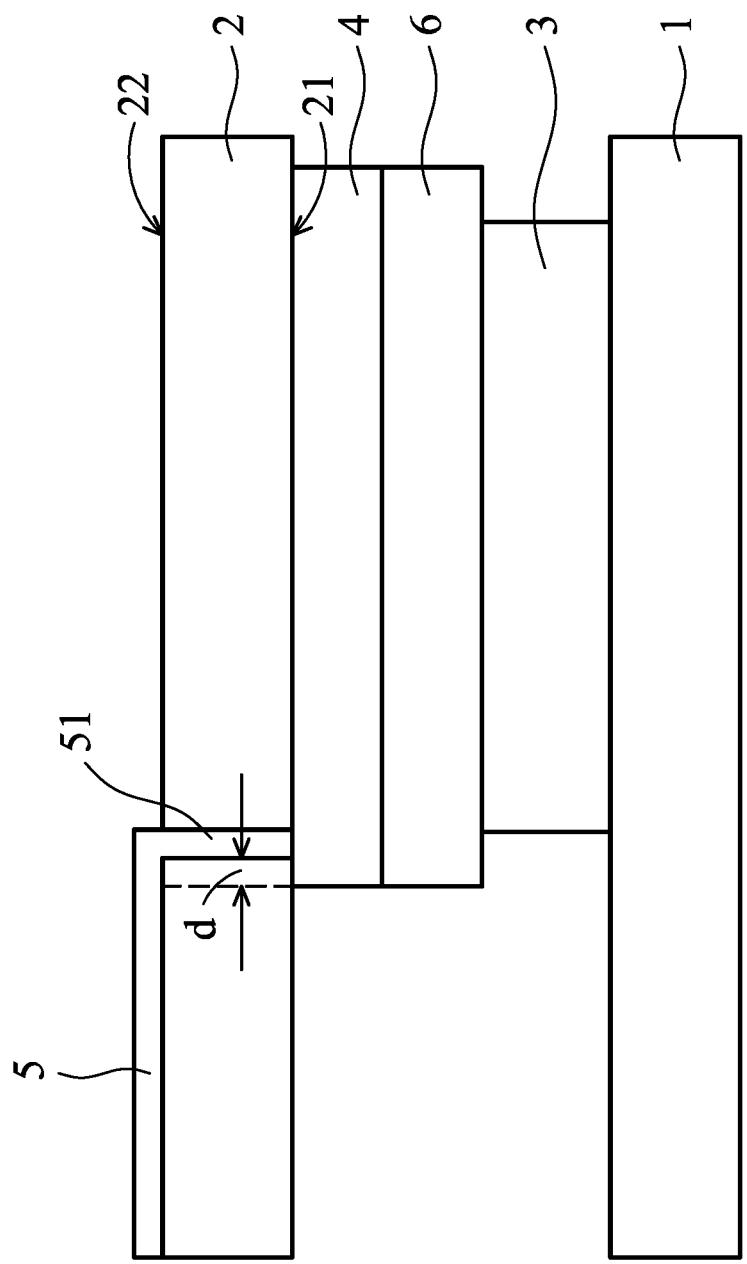
FIG. 3 is a cross-sectional view along direction A-A of FIG. 2.

FIG. 2 is an enlarged top view of the area II of FIG. 1 of the first embodiment. FIG. 3 is a cross-sectional view along direction A-A of FIG. 2. The area II is on the non-display area 12 of the first substrate 1. With reference to FIGS. 2 and 3, the display device D further comprises a plurality of first contact pads 3 (labeled by dotted line), a plurality of second contact pads 4 and a plurality of first traces 5. The first contact pads 3 are disposed on the non-display area 12 of the first substrate 1, and arranged in a first direction X. The second contact pads 4 are disposed on a first side 21 of the second substrate 2 and are arranged in the first direction X. The first traces 5 are disposed on the second side 22 of the second substrate 2. The first traces 5 are respectively electrically connected to the second contact pads 4 through the through holes 51 respectively, and one of the through holes 51 overlaps corresponding one of the second contact pads 4 in a normal direction of the second substrate 2. The normal direction of the second substrate 2 refers to a normal direction of a surface of the second substrate 2. One of the through holes 51 has a projection 511 on the second contact pad 4 in the normal direction of the second substrate 2, and the projection 511 is separated from an edge of the second contact pad 4 by an interval d. The interval d is for example in a range from 0 μm to 2.5 μm. The interval d prevents the first trace 5 from being separated from the second contact pad 4 due to being out of tolerance in manufacturing process.

The through holes 51 can be formed by laser, etching, or mechanical machining. The first contact pad 3, the second contact pad 4 and the first trace 5 can be made of conductive materials such as metal, conductive polymer or transparent conductive material. In another embodiment, the display device D can be OLED, LCD, QD Display or Micro-LED Display.

In FIG. 3, the through holes 51 pass through the second substrate 2, the first traces 5 pass through the through holes 51 to be connected to the second contact pads 4. In another embodiment, the first traces 5 do not pass through the via holes 51. The first traces 5 are electrically connected to the second contact pads 4 by a conductive element filled in the via holes 51. In another embodiment, the second contact pads 4 pass through the through holes 51 to be connected to the first traces 5. In one embodiment, the display device D further comprises a conductive element 6 disposed between one of the first contact pads 3 and corresponding one of the second contact pads 4. In one embodiment, the conductive element 6 includes an anisotropic conductive film. The first contact pads 3 are electrically connected to the second contact pads 4 via the conductive elements, such as anisotropic conductive film (ACF) 6 but are not limited thereto.

In this embodiment, the second contact pad 4 and the first trace 5 are respectively disposed on opposite sides of the second substrate 2, such as the first side 21 and the second side 22. With the increased resolution request of the display device D, the space between the contact pads is decreased. The traces and the contact pads are therefore disposed on opposite sides of the second substrate 2 to prevent the contact pad from being connected to the adjacent trace.

With reference to FIG. 2, in one embodiment, the display device D further includes a plurality of third contact pads 7, which are disposed on the first side 21 of the second substrate 2 and are arranged in the first direction X. With reference to FIGS. 1 and 2, the third contact pads 7 are located between the second contact pads 4 and an edge 23 of the first side 21. And the third contact pads 7 are separated from the second contact pads 4 by a space region S on the first side 21. In other words, a space region S is formed between the third contact pads 7 and the second contact pads 4 in a second direction Y. The third contact pads 7 and the second contact pads 4 are alternatively arranged in a zigzag manner in the first direction X. In other words, when the third contact pads 7 and the second contact pads 4 are projected onto a plane in the normal direction of second substrate 2, the third contact pads 7 and the second contact pads 4 are arranged in a staggered manner.

Utilizing the staggered design above, the number of contact pads is increased in the limited space, and the resolution of the display device is improved. On the other hand, the parasitic capacitance between the traces and the contact pads is decreased due to the staggered contact pads.

With reference to FIG. 2, in one embodiment, the first contact pad 3 has a first edge 31 and a second edge 32 adjacent to the first edge 31. An included angle θ1 between the first edge 31 and the second edge 32 is for example in a range from 70 degrees to 90 degrees. The first edge 31 extends along a third direction W and the second edge 32 extends along the first direction X, and an included angle between the third direction W and the first direction X is for example in a range from 70 degrees to 90 degrees. Utilizing the included angle θ1, the alignment accuracy of the contact pads is improved, the number of contact pads is increased. Or, the resolution of the display device is improved.

With reference to FIG. 2, in the top view of the second substrate 2, the first trace 5 has a first section 52 and a second section 53 connected to the first section 52. The first section 52 is located in the space region S and the second section 53 is located between adjacent two of the third contact pads 7. An included angle θ2 between the first section 52 and the second section 53 is for example in a range from 160 degrees to 180 degrees. The included angle θ2 increases the strength of the traces at the curved portion thereof, and prevents the traces from becoming broken.

With reference to FIG. 2, in the first embodiment, the first section 52 extends in the second direction Y, and the first direction X and the second direction Y are orthogonal. In other words, an included angle between the first direction X and the second direction Y is 90 degrees. The first contact pads 3 and the second contact pads 4 extend in a third direction W, and an included angle θ3 between the third direction W and the second direction Y is for example in a range from zero degree to 20 degrees.

With reference to FIG. 2, in the first embodiment, the third contact pads 7 extend in the third direction W. In one embodiment, the length ratio of the third contact pads 7, the second contact pads 4 and the space region S in the second direction Y is substantially d1:d2:d3=1:1:1.

With reference to FIG. 2, in one embodiment, one of the first contact pads 3 has a first length L1 in the second direction Y, one of the second contact pads 4 has a second length L2, which is equal to d1, in the second direction Y, wherein the first length L1 is less than the second length L2. One of the third contact pads 7 has a third length L3, which is equal to d2, in the second direction Y, wherein the third length L3 is substantially equal to the second length L2.

In the first embodiment, the display device D further comprises a plurality of second traces 8 and a plurality of fourth contact pads 9. The second traces 8 and the fourth contact pads 9 are disposed on the first substrate 1. The fourth contact pads 9 are electrically connected to the third contact pads 7 via the conductive elements, such as anisotropic conductive film (ACF) but are not limited thereto. The fourth contact pads 9 are connected to the second traces 8. The first contact pads 3 and the second traces 8 are alternatively arranged in the first direction X on the first substrate 1. The first contact pads 3 are electrically isolated from the second traces 8. Utilizing the staggered design above, the number of contact pads is increased and the resolution of the display device is improved.

Figure 4:
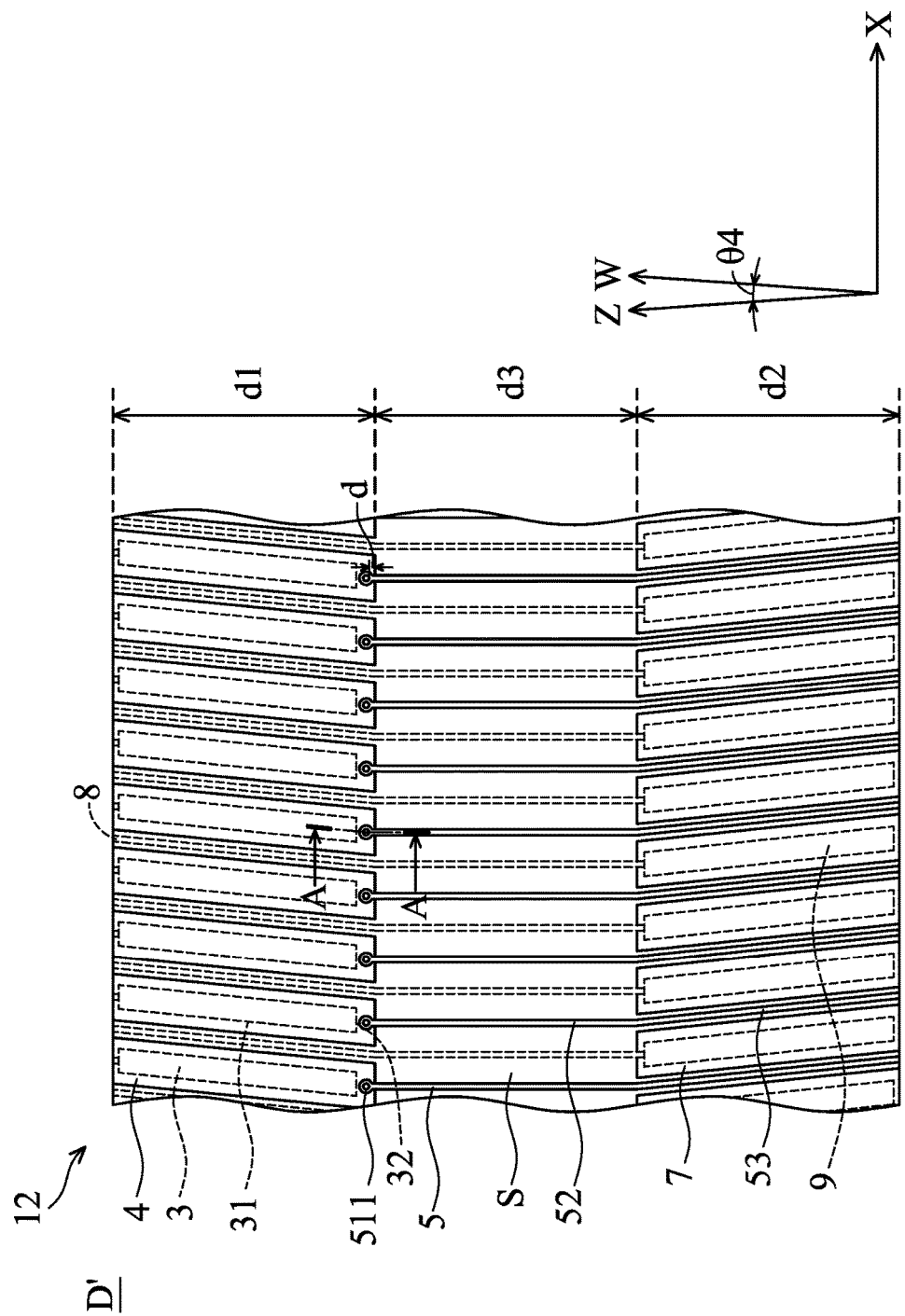
FIG. 4 shows a display device of another embodiment of the disclosure.

FIG. 4 is an enlarged top view of the area II of FIG. 1 of the second embodiment. The area II is on the non-display area 12 of the first substrate 1. With reference to FIGS. 2 and 3, the display device D' further comprises a plurality of first contact pads 3 (denoted as a dotted line), a plurality of second contact pads 4 and a plurality of first traces 5. In the second embodiment, the elements that are the same as those of the first embodiment have the same labels. In the second embodiment, the cross-sectional view along direction A-A of FIG. 4 is the same as the cross-sectional view along direction A-A of FIG. 2 of the first embodiment. With reference to FIGS. 3 and 4, the first contact pads 3 are located in the non-display area 12 of the first substrate 1, and arranged along a first direction X. The second contact pads 4 are located on a first side 21 of the second substrate 2 and are arranged in the first direction X. The first contact pads 3 are electrically connected to the second contact pads 4 via the conductive elements, such as anisotropic conductive film (ACF) 6 but are not limited thereto. The first traces 5 are located on the second side 22 of the second substrate 2. The first traces 5 are respectively electrically connected to the second contact pads 4 through a plurality of through holes 51, and one of the through holes 51 overlaps one of the second contact pads 4 in a normal direction of the second substrate 2. One of the through holes 51 has a projection 511 on the second contact pad 4 in the normal direction of the second substrate 2, and the projection 511 is separated from an edge of the second contact pads 4 by an interval d. The interval d is for example in a range from 0 μm to 2.5 μm.

In this embodiment, the display device D' further includes a plurality of third contact pads 7, which are located on the first side 21 of the second substrate 2 and are arranged in the first direction X. A space region S is formed between the third contact pads 7 and the second contact pads 4 in a second direction Y. The third contact pads 7 are staggered with the second contact pads 4 are alternatively arranged in a zigzag manner in the first direction X. In other words, when the third contact pads 7 and the second contact pads 4 are projected onto a plane in the normal direction of the second substrate 2, the third contact pads 7 and the second contact pads 4 are arranged in a staggered manner. In the second embodiment, the third contact pads 7 extend in a fourth direction Z. The second contact pads 4 extend in a third direction W. The fourth direction Z differs from the third direction W. An included angle θ4 between the third direction W and the fourth direction Z is for example in a range from zero degree to 40 degrees.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term).

The features in different embodiments can be mixed, replaced or substituted to form another embodiment.

While the disclosure has been described by way of example and in terms of the preferred embodiments, it should be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A display device, comprising:
    a first substrate comprising a display area and a non-display area, wherein the display area is adjacent to the non-display area;
    a plurality of first contact pads disposed on the non-display area, and the first contact pads are arranged in a first direction;
    a second substrate comprising a first side and a second side, wherein the first side is opposite to the second side;
    a plurality of second contact pads disposed on the first side, wherein the second contact pads are electrically connected to the first contact pads, and the second contact pads are arranged in the first direction;
    a plurality of first traces disposed on the second side, wherein the first traces are electrically connected to the second contact pads through a plurality of through holes respectively;
    a plurality of third contact pads, disposed on the first side, wherein the third contact pads are separated from the second contact pads, and a space region is formed between the third contact pads and the second contact pads in a second direction, and the first direction and the second direction are orthogonal; and
    a plurality of fourth contact pads, disposed on the first substrate and electrically connected to the third contact pads,
    wherein one of the plurality of through holes overlaps corresponding one of the plurality of second contact pads in a normal direction of the second substrate.

2. The display device as claimed in claim 1, wherein in a top view of the second substrate, the third contact pads are located between the second contact pads and an edge of the first side, and the third contact pads are arranged in the first direction.

3. The display device as claimed in claim 2, wherein in the top view of the second substrate, the second contact pads and the third contact pads are alternatively arranged in a zigzag manner.

4. The display device as claimed in claim 3, wherein in a top view of the second substrate, one of the first traces has a first section and a second section connected to the first section, the first section is located in the space region, and the second section is located between adjacent two of the third contact pads.

5. The display device as claimed in claim 4, wherein an included angle between the first section and the second section is in a range from 160 degrees to 180 degrees.

6. The display device as claimed in claim 4, wherein the first section extends along the second direction, and an included angle between the first direction and the second direction is 90 degrees.

7. The display device as claimed in claim 1, wherein each one of the second contact pads extends in a third direction, and an included angle between the third direction and the second direction is in a range from zero degree to 20 degrees.

8. The display device as claimed in claim 7, wherein each one of the third contact pads extends in the third direction.

9. The display device as claimed in claim 8, wherein each one of the third contact pads extend in a fourth direction, and an included angle between the fourth direction and the third direction is in a range from zero degree to 40 degrees.

10. The display device as claimed in claim 1, wherein one of the first contact pads has a first length in the second direction, one of the second contact pads has a second length in the second direction, and the first length is less than the second length.

11. The display device as claimed in claim 10, wherein one of the third contact pads has a third length in the second direction, wherein the third length is substantially equal to the second length.

12. The display device as claimed in claim 1, wherein one of the first contact pads has a first edge and a second edge connected to the first edge, and an included angle between the first edge and the second edge is in a range from 70 degrees to 90 degrees.

13. The display device as claimed in claim 1, further comprising a plurality of second traces disposed on the first substrate, and the plurality of second traces are respectively connected to the fourth contact pads, wherein the first contact pads and the second traces are alternatively arranged in the first direction, and the first contact pads are electrically isolated from the second traces.

14. The display device as claimed in claim 1, wherein one of the through holes has a projection on the second contact pad in the normal direction of the second substrate, and the projection is separated from an edge of the second contact pad by an interval.

15. The display device as claimed in claim 1, further comprising a conductive element disposed between one of the first contact pads and corresponding one of the second contact pads.

16. The display device as claimed in claim 15, wherein the conductive element includes an anisotropic conductive film.

17. The display device as claimed in claim 1, wherein the second substrate is a flexible substrate.

* * * * *